(12) United States Patent
Trimberger

(10) Patent No.: US 7,111,224 B1
(45) Date of Patent: Sep. 19, 2006

(54) FPGA CONFIGURATION MEMORY WITH BUILT-IN ERROR CORRECTION MECHANISM

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 715 days.

(21) Appl. No.: 09/797,138

(22) Filed: Feb. 28, 2001

(51) Int. Cl.
*G11C 29/00* (2006.01)
*G01R 31/28* (2006.01)

(52) U.S. Cl. .................. 714/764; 714/725; 326/38; 326/39; 716/3; 716/16; 716/17; 716/19

(58) Field of Classification Search ................ 714/764, 714/710–711, 718, 724, 719, 733–734; 257/202, 257/209; 716/17–16
See application file for complete search history.

(56) References Cited

U.S. PATENT DOCUMENTS

| | | | |
|---|---|---|---|
| 5,426,379 A | | 6/1995 | Trimberger |
| 5,430,687 A | | 7/1995 | Hung et al. |
| 5,764,564 A | | 6/1998 | Frake et al. |
| 6,101,624 A | * | 8/2000 | Cheng et al. ............... 714/736 |
| 6,102,963 A | * | 8/2000 | Agrawal ..................... 716/17 |
| 6,175,940 B1 | * | 1/2001 | Saunders .................... 714/746 |
| 6,550,030 B1 | * | 4/2003 | Abramovici et al. ........ 714/725 |

OTHER PUBLICATIONS

Felton et al. 'Configuration Data Verification and the Integrity Checking of SRAM-based FPGAs:' 1991.*
Huang et al. "A Memory Coherence Technique for Online Transient Error Recovery of FPGA Configurations;" Feb. 13, 2001.*

* cited by examiner

*Primary Examiner*—Guy J. Lamarre
(74) *Attorney, Agent, or Firm*—H. C. Chan; B. Hoffman; John J. King

(57) ABSTRACT

An on-chip error correction circuit can be used to correct errors in memory cells of a FPGA. In one embodiment of the invention, the circuit can compute, during configuration, a plurality of error correction bits. These error correction bits are stored in a designated location on the FPGA. After all the memory cells are configured, the error correction circuit continuously computes the error correction bits of the memory cells and compares the result to the corresponding values stored in the designated location. If there is discrepancy, the stored error correction bits are used to correct the errors. In another embodiment of the invention, a plurality of parity bits of the original configuration bits is calculated. These parity bits are stored in registers. The FPGA contains on-chip parity bit generators that generate the corresponding parity bits. A discrepancy between the generated and stored parity bits triggers error correction action.

23 Claims, 11 Drawing Sheets ated mechanism in the FPGA.

FPGA CONFIGURATION MEMORY WITH BUILT-IN ERROR CORRECTION MECHANISM

FIELD OF THE INVENTION

This invention relates to programmable logic devices, and more particularly to a field programmable gate array that has build-in error correction mechanism.

BACKGROUND OF THE INVENTION

Digital logic can be implemented using several options: discrete logic devices, often called small-scale integrated circuits or SSI, programmable devices such as programmable logic arrays (PLAs) or programmable logic devices (PLDs), masked-programmed gate arrays or cell-based application specific integrated circuits (ASICs), and field programmable gate arrays (FPGAs).

FPGAs are general purpose programmable devices that are customized by the end users. FPGAs are composed of an array of configurable logic blocks that are programmably interconnected. The basic device architecture of an FPGA consists of an array of configurable logic blocks (CLBs) embedded in a configurable interconnect structure and surrounded by configurable I/O blocks (IOBs). An IOB allows signals to be driven off-chip or optionally brought onto the FPGA onto interconnect segments. The IOB can typically perform other functions, such as tri-stating outputs and registering incoming or out-going signals. The configurable interconnect structure allows users to implement multi-level logic designs (multi-level refers to logic in which the output signal of one logic unit provides input to another logic unit and the output of that provides input to another, etc.). An FPGA can support hundreds of thousands of gates of logic operating at system speeds of tens of megahertz. The FPGA is programmed by loading programming data into the memory cells controlling the configurable logic blocks, I/O blocks, and interconnect structure.

Each configurable logic block in the FPGA can include configuration memory cells for controlling the function performed by that logic block. These configuration memory cells can implement a lookup table, control multiplexers, and control other logic elements such as XOR gates and AND gates. A lookup table stores a truth table which implements that combinational logic function corresponding to the truth table. Each configurable logic block is associated with an adjacent portion of the interconnect structure. The interconnect structure includes programmable interconnect points which control the connection of wiring segments in the programmable interconnect network of the FPGA. Each programmable interconnect point may be a pass transistor controlled by a configuration memory cell. Wire segments on each side of the pass transistor are either connected or not connected depending on whether the transistor is turned on by the corresponding configuration memory cell.

Configuration is the process of loading a stream of bits containing the program data into the configuration memory cells which control the configurable logic blocks and I/O blocks of the FPGA. The bitstream is loaded into the FPGA serially to minimize the number of pins required for configuration and to reduce the complexity of the interface to external memory. The bitstream is broken into packets of data called frames. As each frame is received, it is shifted through a frame register until the frame register is filled. The data in the frame register of the FPGA are then loaded in parallel into one column of configuration memory cells forming the memory array. (The configuration memory cells which control a configurable logic block typically occupy a two dimensional section of the array.) The configuration memory cells make up the lookup tables and control programmable interconnect points, multiplexers, and other programmable elements of a configurable logic block or I/O block. Following the loading of the first frame, subsequent frames of bitstream data are shifted into the FPGA, and another column of configuration memory cells in the array of CLBs is designated to be loaded with a frame of bitstream data.

Because the functions performed by the logic or I/O blocks are determined by the values of the configuration memory cells, any error in the values could affect the functions. In a FPGA configured to implement a complex design, it is possible that a single error could render the design inoperative. Although the memory cells are normally very reliable, there is a concern that they might be disturbed in a high-radiation or high-temperature environment. Consequently, it is desirable to include an error correction mechanism in the FPGA.

SUMMARY OF THE INVENTION

The present invention allows errors in memory cells to be quickly detected and corrected. In one embodiment of the present invention, the FPGA contains an error correction code circuit that can compute, during configuration, error correction bits of data in each frame. The error correction bits of each frame are stored in a designated location in a memory on the FPGA. These bits can later be used to correct one or more error bits in each column of memory cells.

After all the memory cells are configured, the data in the memory cells can be read back column after column in a continuous manner. When each column is read, the error correction code circuit computes the error correction bits, and compares the result to the corresponding value stored in the memory location. If there is no discrepancy, it is assumed that there is no error. If there is discrepancy, the stored error correction bits are used to correct errors. One advantage of this embodiment is that no external circuitry is required to perform error correction. Another advantage is that only one error correction code circuit is needed for all the columns.

In some situations, the states of some of the components in a CLB (e.g., flip-flops and random access memory) may be changed after configuration under normal operation. It is important that the states of these components are not be affected by the system of the present invention. One way to handle these situations is to provide a mask that removes these states from the calculation of the error correction bits. Another way is to use a logic device that can prevent these components from affecting the computed error correction bits after their states have been changed.

In another embodiment of the present invention, a plurality of parity bits of the original configuration bits is calculated. Each bit corresponds to the parity of a combination of memory cells (e.g., one or more frames or a fraction of a frame). The parity bits computed from the original configuration bits are stored in registers. The FPGA contains on-chip parity bit generators that generate the parity bits corresponding to the same combination of memory cells. The output of each parity bit generator is coupled to one input of an XOR gate, and the corresponding original parity bit is coupled to the other input of the XOR gate. A change in the output state of the XOR gate indicates an error. After an error is detected, the correct data can be obtained from an external memory. Alternatively, the error correction bits, described above, can be used to correct errors. In this case, there is no need to use an external memory. This embodiment allows errors to be corrected without continuously reading the configuration memory.

The above summary of the present invention is not intended to describe each disclosed embodiment of the present invention. The figures and detailed description that follow provide additional example embodiments and aspects of the present invention.

BRIEF DESCRIPTION OF THE DRAWINGS

The present invention is illustrated by way of example, and not by way of limitation, in the detailed description and the following figures, in which like reference numerals refer to similar elements.

DETAILED DESCRIPTION OF THE INVENTION

The present invention relates to FPGA error correction systems and methods. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 1:
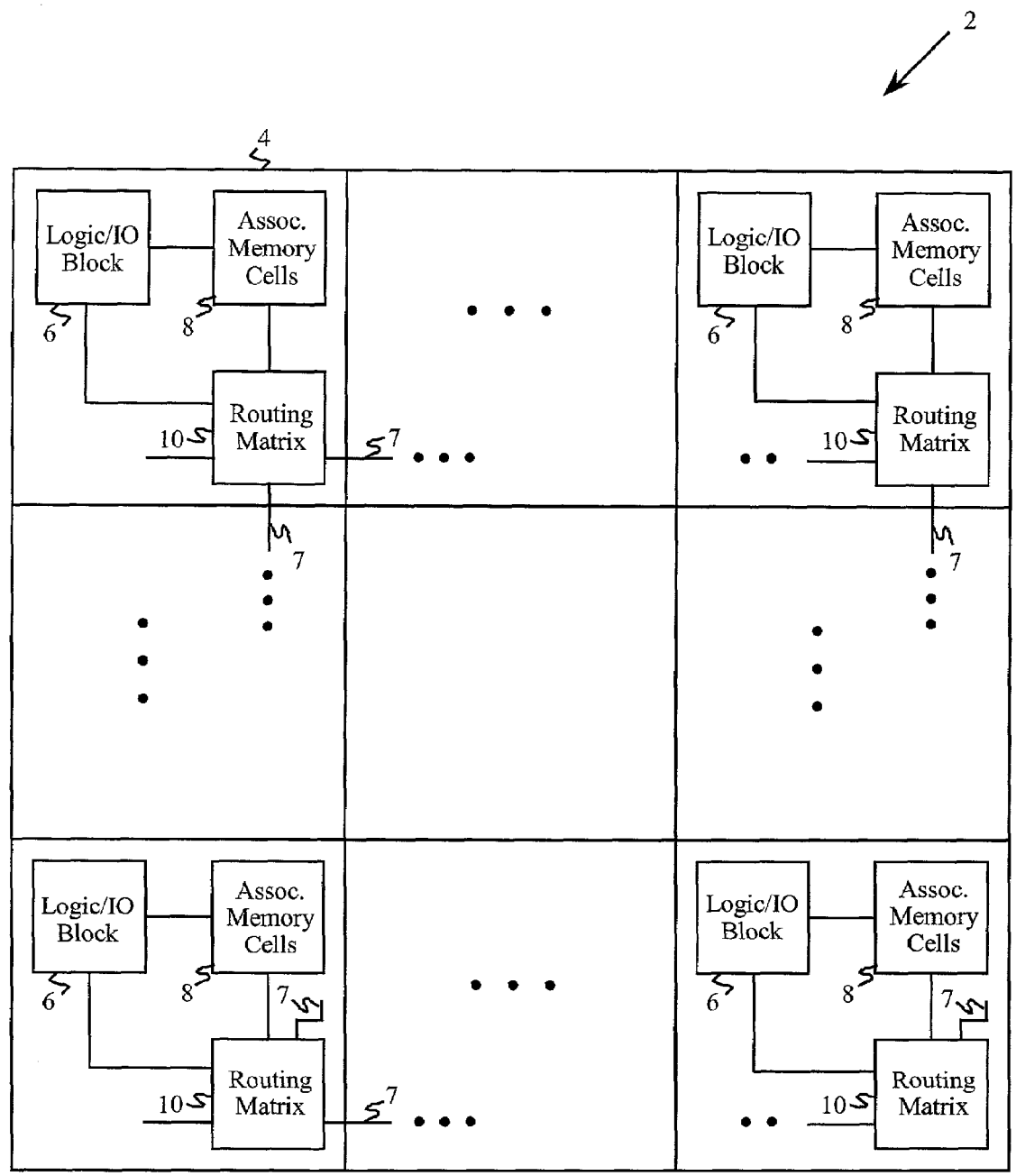
FIG. 1 is a schematic diagram showing a FPGA system of the present invention.

FIG. 1 shows a schematic diagram of an embodiment of an FPGA 2 on which the invention may be used. FPGA 2 comprises a plurality of CLBs 4. Each CLB 4 in turn comprises a logic/IO block 6, a routing matrix 10 and associated memory cell group 8. Even though FIG. 1 shows block 6, matrix 10 and memory cell group 8 as individual blocks with sharp boundary, they may be physically distributed throughout the CLB. Logic/IO block 6 is preferably a logic and/or input-output block that can be configured to perform one of a variety of logical and/or input-output functions. For example, logic/IO block 6 may be configured to be a wide AND gate decoder, a multi-bit adder, a multi-input combinational function generator, etc. Logic/IO block 6 is configured by storing data in the associated memory cell group 8 for logic/IO block 6. Transistor gates in logic/IO block 6 are coupled to associated memory cell group 8 for being controlled by configuration data that specifies the function logic/IO block 6 is to perform. Routing matrix 10 is used to couple the inputs and outputs of logic/IO block 6 with the inputs and outputs of other logic/IO blocks 6 via a plurality of programmable interconnections 7 for creating complex circuits on FPGA 2. Routing matrix 10 is also coupled to associated memory cell group 8 and is controlled by configuration data that are applied to the inputs of routing matrix 10 so that the inputs and outputs of logic/IO block 6 are coupled as desired.

Figure 2:
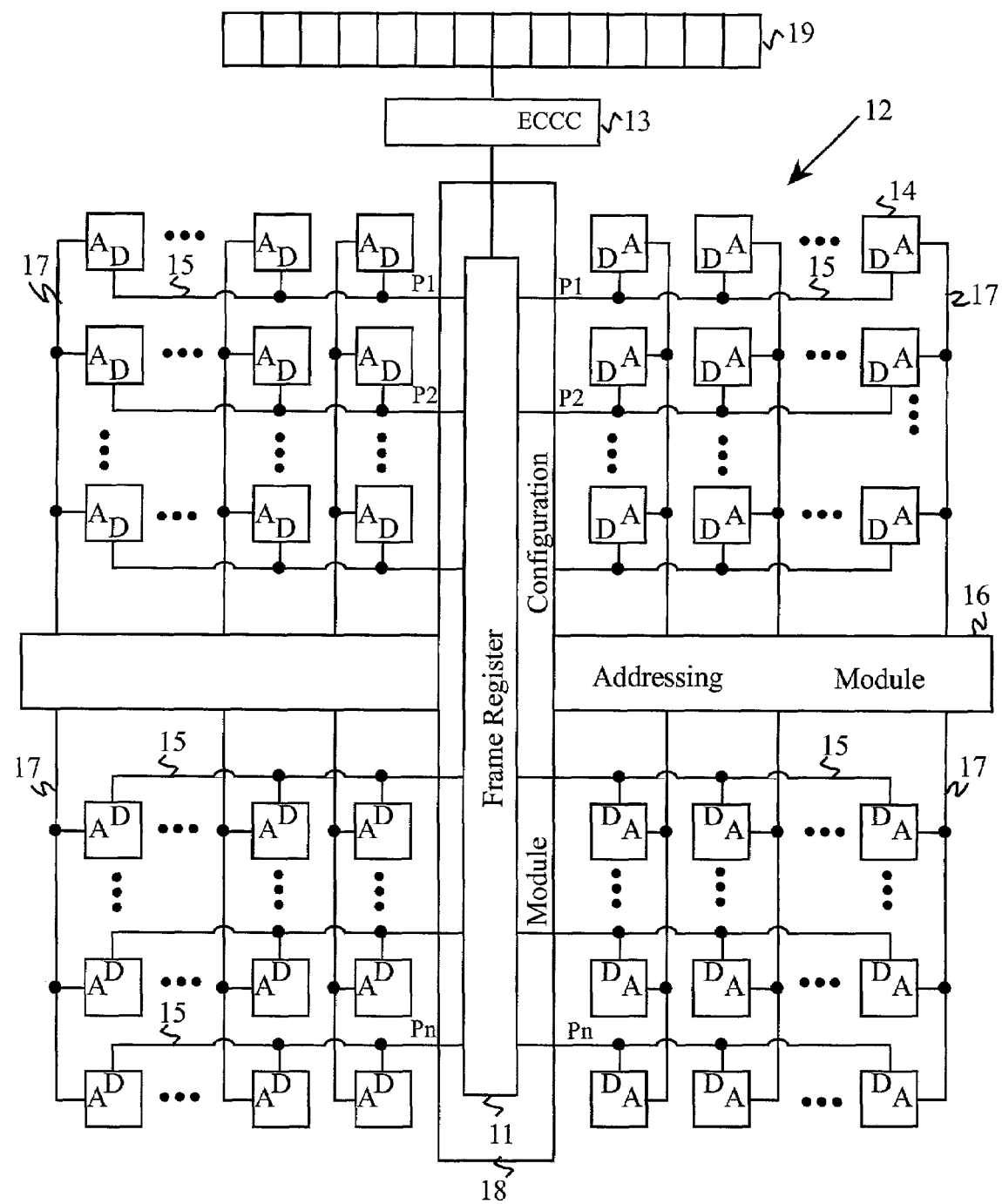
FIGS. 2 and 2A are schematic diagrams of a configuration memory system of the present invention.

Associated memory cell group 8 shown in FIG. 1 is preferably a group or section of configuration memory cells 14 from an array 12 of memory cells 14 (See FIG. 2). Memory cells 14 are preferably arranged in array 12 in rows and columns. In one embodiment of FPGA 2, logic/IO block 6, routing matrix 10, and associated memory cell group 8 of each CLB 4 are grouped together physically near each other across FPGA 2. This is advantageous because it reduces the amount of wiring need. These components 6, 8, 10 may, however, be separated from each other or arranged in other configurations without departing from the spirit of the present invention. In any case, the electrical correspondence among components 6, 8, 10 is maintained. Thus, for each CLB of an FPGA there is a specific logic/IO block 6, a specific memory cell group 8, and a specific routing matrix 10. The memory cells, however, may be physically grouped together in one large array of memory cells whether or not the components of each gate array cell are separated. This large array of memory cells may be either separated from the logic/IO blocks or may be integrated with the logic/IO blocks and routing matrices.

Referring now to FIG. 2, a schematic diagram of one embodiment of a configuration memory system of the present invention is shown. This system comprises an array 12 of memory cells 14, an addressing module 16, a configuration module 18, an error correction code circuit (ECCC) 13, and an error correction bits storage 19. Circuit 13 and storage 19 are used for detecting and correcting errors of memory cells 14 in array 12.

Figure 2A:
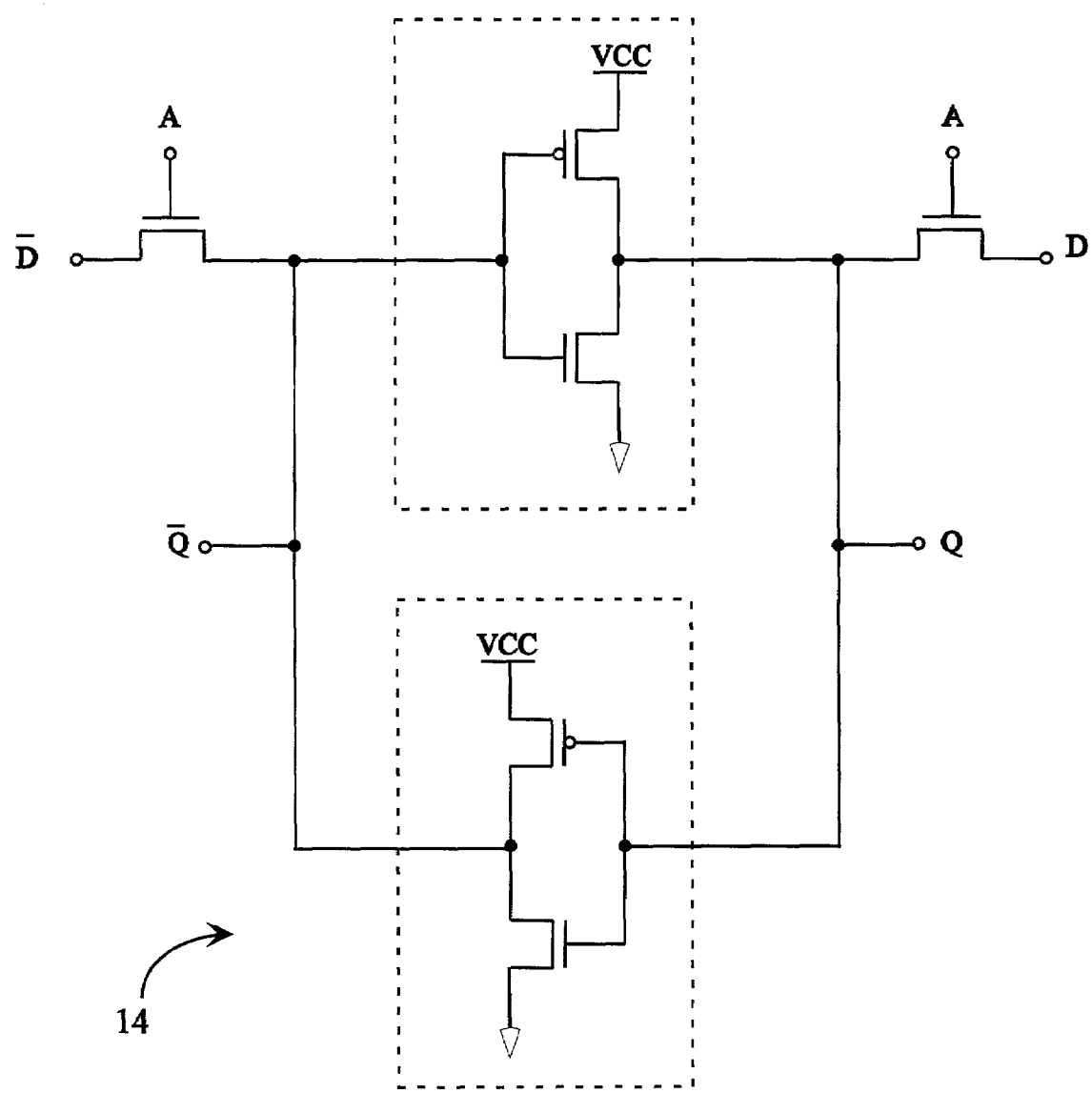

Memory cells 14 are arranged in rows and columns. Each memory cell 14 has two inputs. One input, labeled D in FIG. 2, is a data input and is coupled to a frame register 11 of configuration module 18. The other input, labeled A in FIG. 2, is an address input and is coupled to addressing module 16. A signal applied on address input A controls when data on data input D will be loaded or stored into memory cell 14. In addition, each memory cell 14 has outputs that are coupled to the appropriate logic/IO block 6. FIG. 2A shows a memory cell 14 with its data input D, its address input A, and its outputs Q and Q coupled to the gates of transistors in logic/IO block 6. This and other memory cell structures are further discussed in U.S. Pat. No. 5,764,564 which is incorporated herein by reference. Memory cells 14 are preferably static random access memory cells, however, those skilled in the art will realize that memory cells 14 may be implemented with other equivalent circuits such as an array of D-flip-flops or EEPROM cells.

The present invention also provides a plurality of row buses 15 and column buses 17 for coupling the data inputs and the address inputs, respectively. In the embodiment of FIG. 2, each row bus 15 is coupled to the data input of each memory cell 14 in a row. Thus, there is one row bus 15 for each row of memory cells 14 in array 12. The data inputs for each row of memory cell 14 correspond to the data in frame register 11. Similarly, each column bus 17 is coupled to the address input of each memory cell 14 in a column. There is one column bus 17 for each column of memory cells 14 in array 12. Thus, each time the address signal is asserted on a column bus 17, all the memory cells 14 in that column are loaded or written with data stored in frame register 11. Therefore, an entire column of data can be written to array 12 simultaneously when an address is asserted. More details about addressing module 16 and configuration module 18 will be provided below.

Figure 2B:
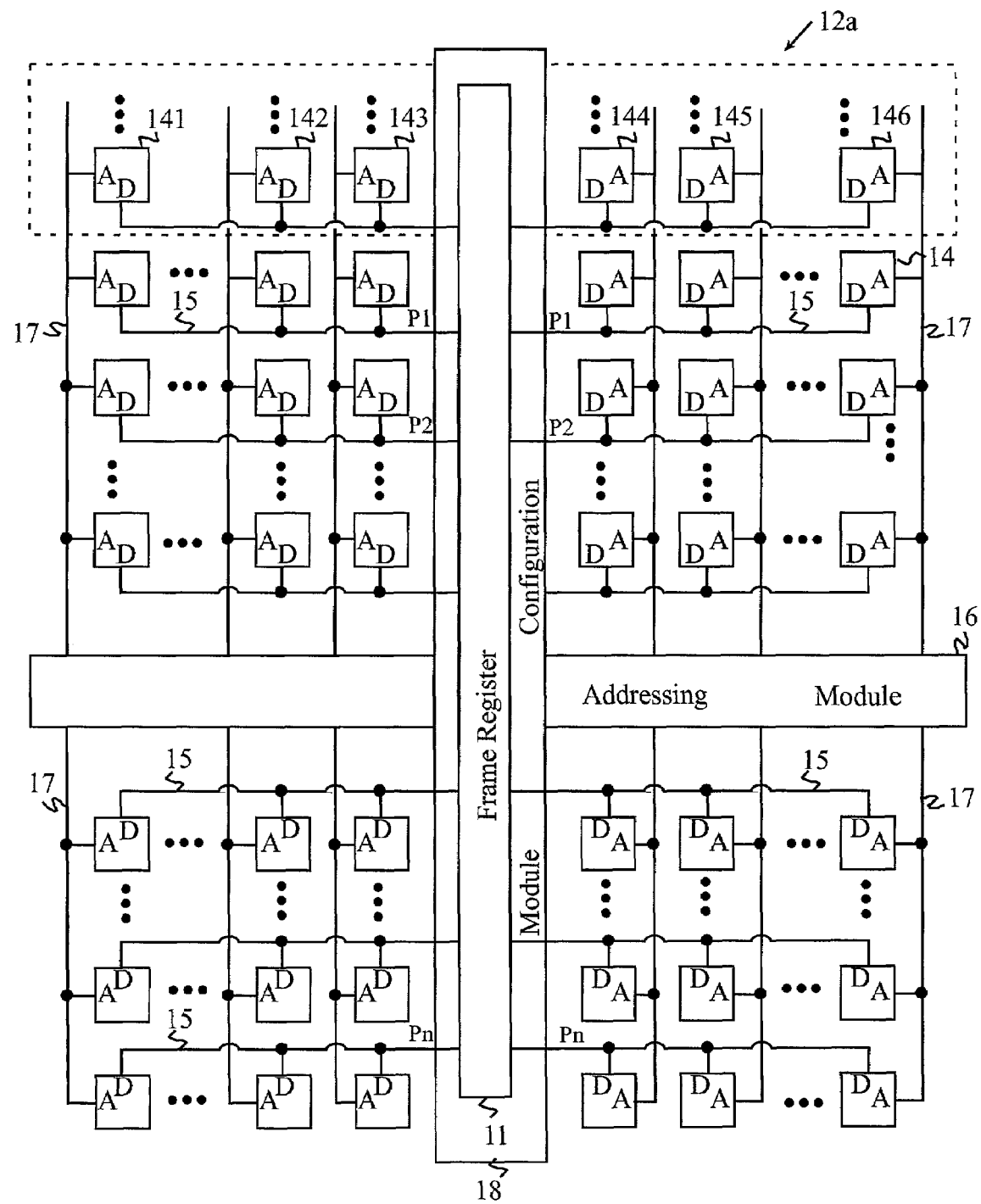
FIG. 2B shows an alternative configuration memory system of the present invention.

In one embodiment of the present invention, the error correction bits can be introduced into each frame (instead of centrally stored in one location). FIG. 2B shows such an embodiment of an array 12a. A plurality of error correction bits, such as bits 141–146, are added to the regular array. Typically, each frame includes multiple error correction bits for single-error correction. This plurality of distributed error correction bits functions in the same way as storage 19. In this embodiment, all the bits in a frame, including the error correction bits, can be read back at the same time.

Figure 3:
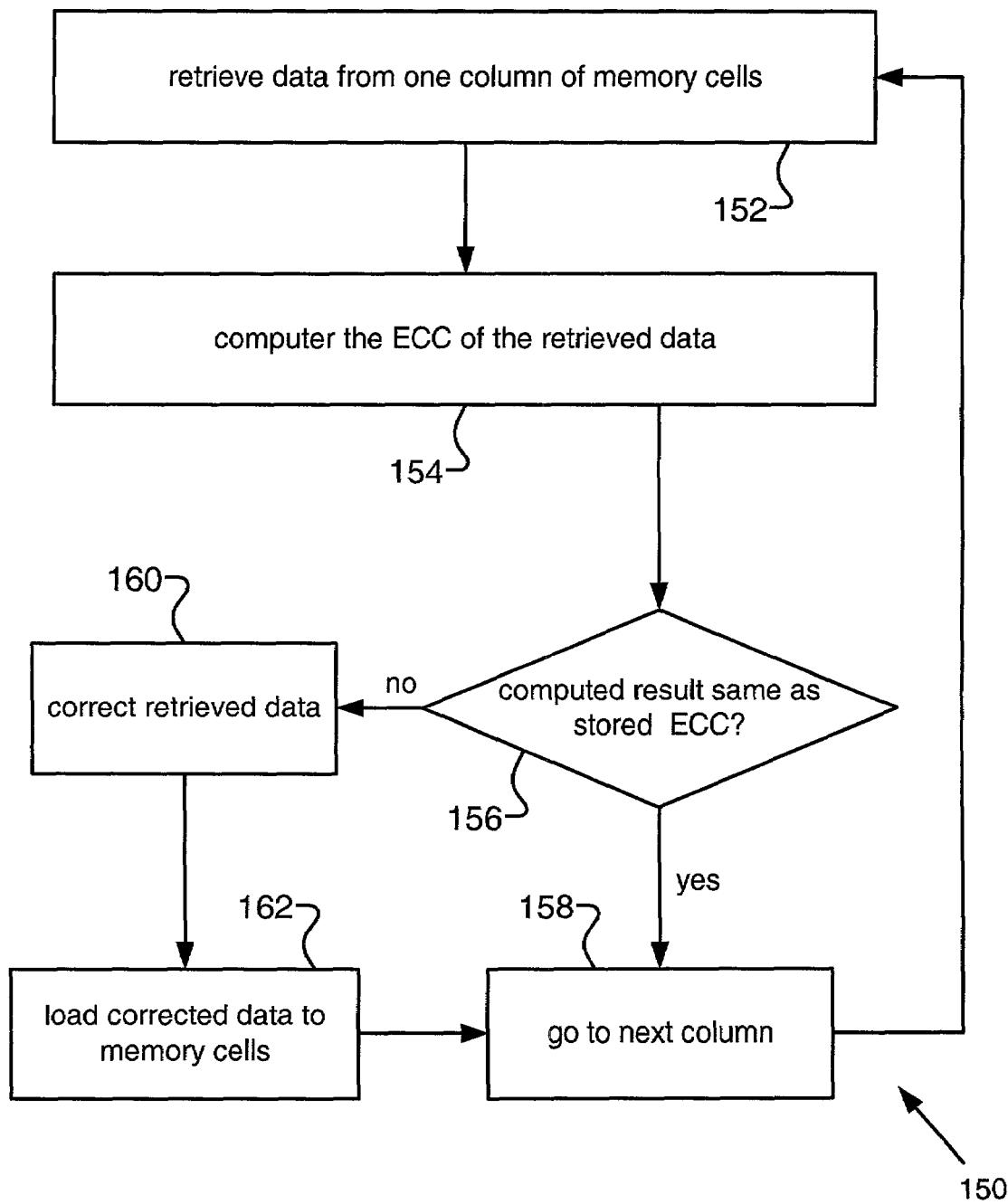
FIG. 3 is a flow chart showing a method of the present invention to correct errors in the configuration memory system of FIG. 2.

In one embodiment of the present invention, data in memory cells 14 can be read by configuration module 18 after configuration. The read back allows errors in the data to be corrected. A flow chart 150 showing such a method is described in FIG. 3. In step 152, addressing module 16 and configuration module 18 retrieve data from one column of memory cells 14. In an embodiment of the present invention, this data can be loaded to frame register 11, although another register (in or outside of ECCC 13) may be used. The retrieved data in frame register 11 is sent to ECCC 13. ECCC 13 can access data in storage 19, which contains a plurality of memory locations each for storing the error correction bits of an associated column of memory cells 14. In step 154, ECCC 13 computes the error correction bits of the retrieved data, and compares them with the corresponding error correction bits in storage 19 (step 156). If the computed value is the same as the stored value, it indicates that there is no error. Data in the next column of memory cells will be retrieved and compared (step 258). If the computed value is different from the stored value, it indicates that there is an error. The stored error correction bits will be used to correct the retrieved value in frame register 11 (step 160). The corrected data is loaded back, into the corresponding column of memory cells (step 162). The memory cells of the next column will be analyzed (step 158).

In an embodiment of the present invention, the error correction bits can be used to correct a single bit of error in one column of memory cells 14. In another embodiment of the invention, several bits of errors in a column can be corrected. It should be noted that the size of storage 19 needs to be increased if there is a need to correct multiple bits in a column. Many error correction codes and circuits have been disclosed in various publications (e.g., J. Wakerly, "Error Detecting Codes, Self-Checking Circuits and Applications," Elsevier North-Holland, New York, 1978), and they can be used in the present invention.

In one embodiment of the present invention, the error correction bits can be generated on-chip. In this embodiment, configuration module 18 copies the data in frame register 11 to ECCC 13 when the data is first loaded into frame register 11 during configuration. ECCC 13 computes the error correction bits, and stores the bits into a corresponding location in storage 19. In another embodiment of the present invention, the error correction bits are generated off-chip. These bits are integrated into the configuration bitstream, and delivered to the FPGA during power up. In this case ECCC 13 merely retrieves the error correction bits from the bitstream, and stores the bits into appropriate locations in storage 19.

Figure 4:
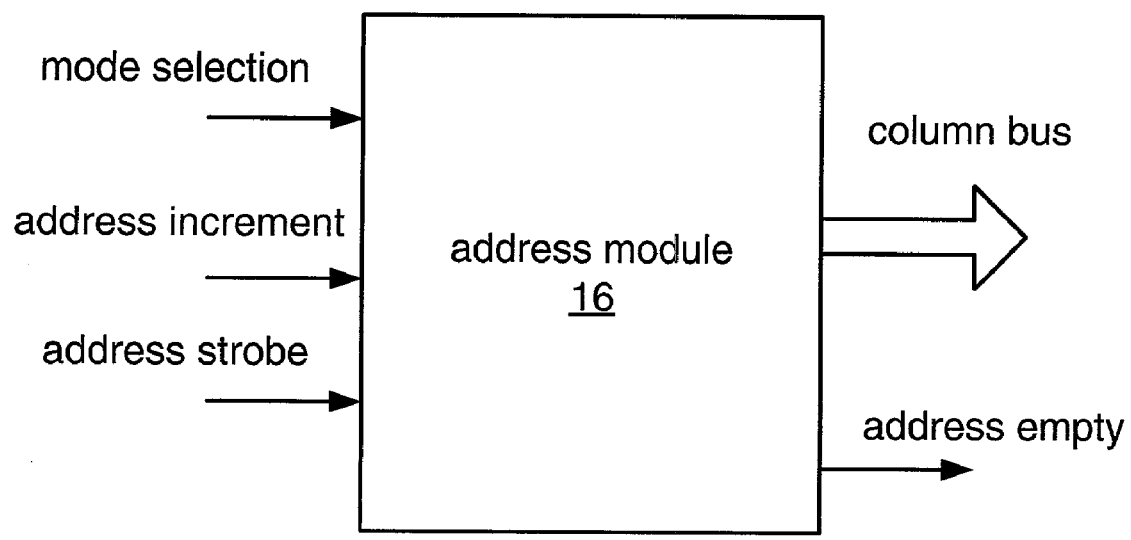
FIG. 4 is a schematic diagram showing the input and output signals of an address module of the present invention.

The structure and operation of address module 16 are now described in detail. Address module 16 specifies the column of array 12 that is to be loaded with data from configuration module 18. As shown in FIG. 4, address module 16 preferably accepts a mode selection input, an address increment input, and an address strobe input. The mode selection input directs address module 16 to operate in one of two modes: a configuration mode (active during configuration) and an error correction mode (active after configuration for error detection and correction). Address module 16 generates an address empty output and a column bus. Address module 16 preferably has a number of stages equal in number to the number of columns in array 12. Each stage stores a bit that specifies whether a particular column is to be addressed. Each of the plurality of lines in the column bus is coupled to the address input of memory cells 14 in a respective column of array 12. For example, a first output of address module 16 is coupled to the address inputs of memory cells 14 in the first column of array 12. A second address output of address module 16 is coupled to the address inputs of memory cells 14 in the second column of array 12. Each subsequent column of memory cells 14 of array 12 is similarly coupled to a respective address output of address module 16. The address increment input provides a way of incrementing the stages of address module 16.

In the configuration mode, each column of array 12 is active once. Thus, each memory cell 14 is configured once. After all the columns have been addressed, address module 16 generates the address empty output to indicate the end of configuration. In the error correction mode, one column after another is active in a continuous sequential manner because the memory cells need to be verified repeatedly. Thus, no address empty output is generated.

Address module 16 accepts the address strobe input generated by control unit 24a for controlling whether the address lines in the column bus are asserted. This is advantageous because the memory cells 14 of array 12 will be accessed only when the address strobe signal is applied.

Figure 5:
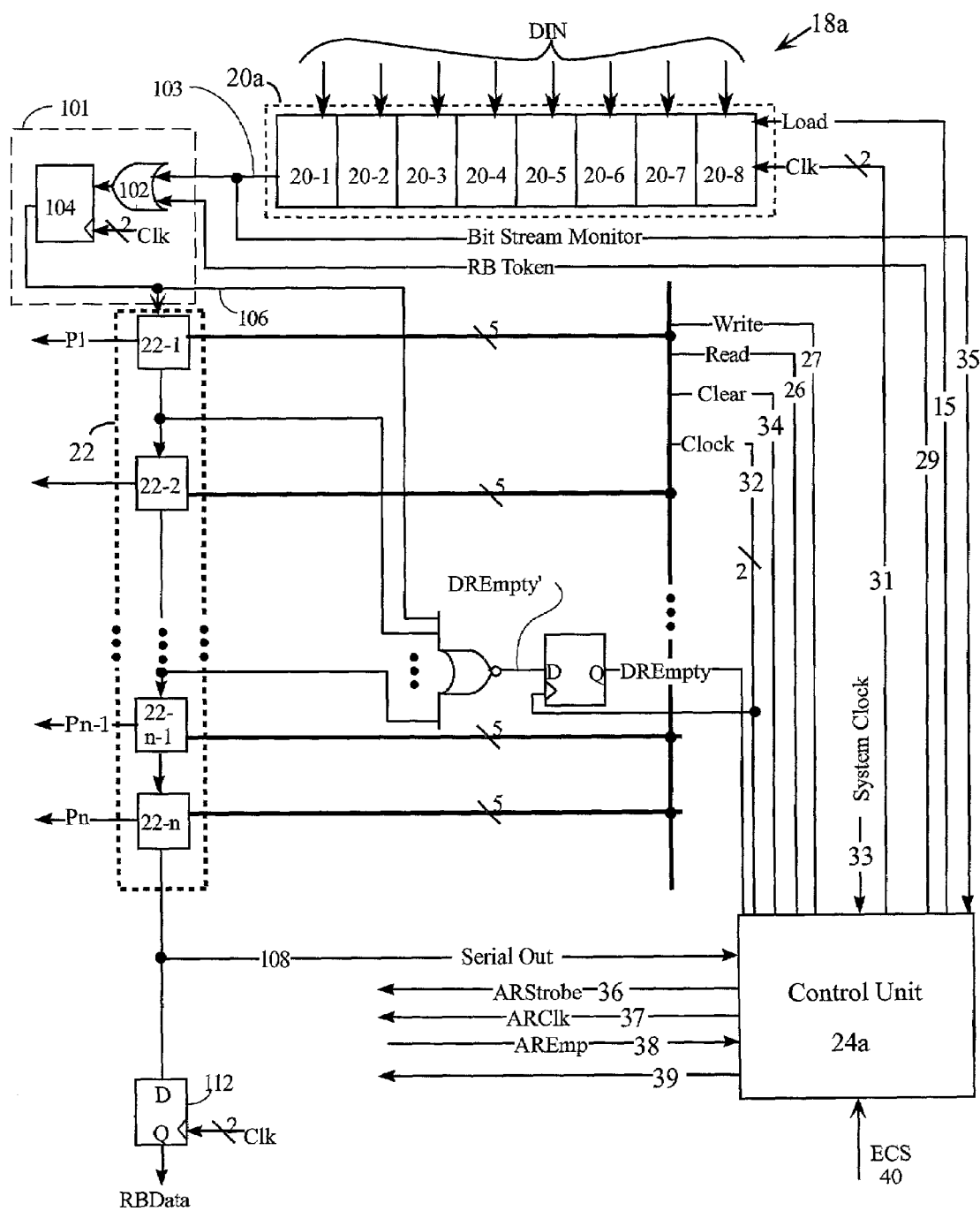
FIGS. 5 and 5A are schematic diagrams showing a configuration module of the present invention.

The structure and operation of configuration module 18 are now described in detail. Referring now to FIG. 5, it shows a schematic diagram of a configuration module 18a that can be used in the present invention. Configuration module 18a comprises a data input register 20a, a read-back select unit 101, a data shift register 22, a readback data flip flop 112, and a control unit 24a.

Data input register 20a is a parallel in, serial out shift register having eight stages 20-1 through 20-8. Data input register 20a has eight data input terminals DIN, two clock input terminals 31, a load input terminal 15, and a serial output terminal 103. The data to be stored in memory cells 14 are applied to the eight data input terminals DIN for loading. The data are loaded in parallel, eight bits at a time, through the input terminals of data input register 20a. The data are then serially transferred out of data input register 20a onto terminal 103. The output of a first stage 20-1 is the serial output of data input register 20a. It should be noted that register 20a may have more (or less) than eight stages.

Data are transferred out of data input register 20a through OR gate 102 into flip flop 104 and from there into shift register 22. Shift register 22 is a serial-in, parallel-out shift register and comprises a plurality of stages 22-1 through 22-n. Shift register 22 receives a two-phase clock signal on a bus 32, a clear input signal on line 34, a data input signal on line 106, and provides a serial data output signal (Serial Out) on line 108 and a plurality of parallel data output signals on lines P1 through Pn. There is a stage for each row of memory cells 14 in array 12. Stages 22-1 through 22-n shift data one stage down for each cycle of the clock signal on bus 32. The data input terminal of shift register 22 is coupled to line 106. As shown in FIG. 2, each of the plurality of parallel data output lines P1 through Pn is coupled to a row of memory cells 14 in array 12. The serial data output of data shift register 22 on line 108 is coupled to control unit 24a.

Control unit 24a comprises a state machine which generates a plurality of signals to control the operation of configuration module 18a. The signals generated by control unit 24a include: a two-phase clock signal Clk on bus 31 coupled to the clock input terminals of each cell in data input register 20a, to readback select unit 101 and to readback data flip flop 112; a load signal (Load) on line 15 coupled to the load input terminal of data input register 20a; a second two-phase clock signal (Clock) on bus 32 coupled to the clock input terminals of data shift register 22; and a clear signal (Clear) on line 34 coupled to the clear input terminals of stages of data shift register 22 for clearing data shift register 22. In one embodiment of configuration module 18a, the first clock signal (Clk) may be identical to the second clock signal (Clock).

Those skilled in the art will recognize how to construct control unit 24a from the functional description that follows.

To place shift register into configuration mode, control unit 24a applies a high signal on write line 27. This allows data shift register 22 to shift data. The write signal remains high and the read signal remains low during the entire configuration sequence. Control unit 24a also set a mode selection signal 39 into one value (e.g., a "high" value). This signal is coupled to the mode selection input of address module 16 to indicate that a configuration mode is in progress.

Before data are loaded into data shift register 22, data shift register 22 is cleared to logic "0" by asserting a Clear signal on line 34. The first bit loaded into the first stage 20-1 of data input register 20a is preferably a control bit ("1") and the remaining bits loaded into stages 20-2 through 20-8 are the first seven bits data to be loaded into memory cells 14. Data shift register 22 is then clocked to load the control bit from first stage 20-1 of data input register 20a through readback select unit 101 to first stage 22-1 of data shift register 22. The remaining bits loaded into data input register 20a are serially shifted into data shift register 22 by clocking data input register 20a, readback select unit 101, and data shift register 22 seven more times. This process of loading and serially shifting is repeated once for each eight rows of memory cells 14 in array 12. For example, this process would be repeated at least three times if there were twenty-four rows in array 12.

When control unit 24a shifts the control bit out of the last stage 22-n of data shift register 22, control unit 24a recognizes that data shift register 22 is fully loaded and that the data may be transferred to the column of memory cells 14 of array 12. Control unit 24a then applies an address strobe signal on line 36, to store the data held in data shift register 22 into a column of memory cells 14 in array 12. This strobe signal is applied to the address strobe input of address module 16. Control unit 24a continues to assert the strobe signal until control unit 24a detects a control bit on bit stream monitor line 35 which connects to the output terminal of data input register 20a. Control unit 24a then applies the address clock signal on line 37. This signal is connected to the address increment input of address module 16, and it causes address module 16 to advance to the next column. When all the columns in array 12 have been taken care of, address module 16 returns a high AREmp signal on its address empty output. This signal is coupled to line 38 to indicate that address module 16 is empty and the entire array 12 has been loaded.

Figure 5A:
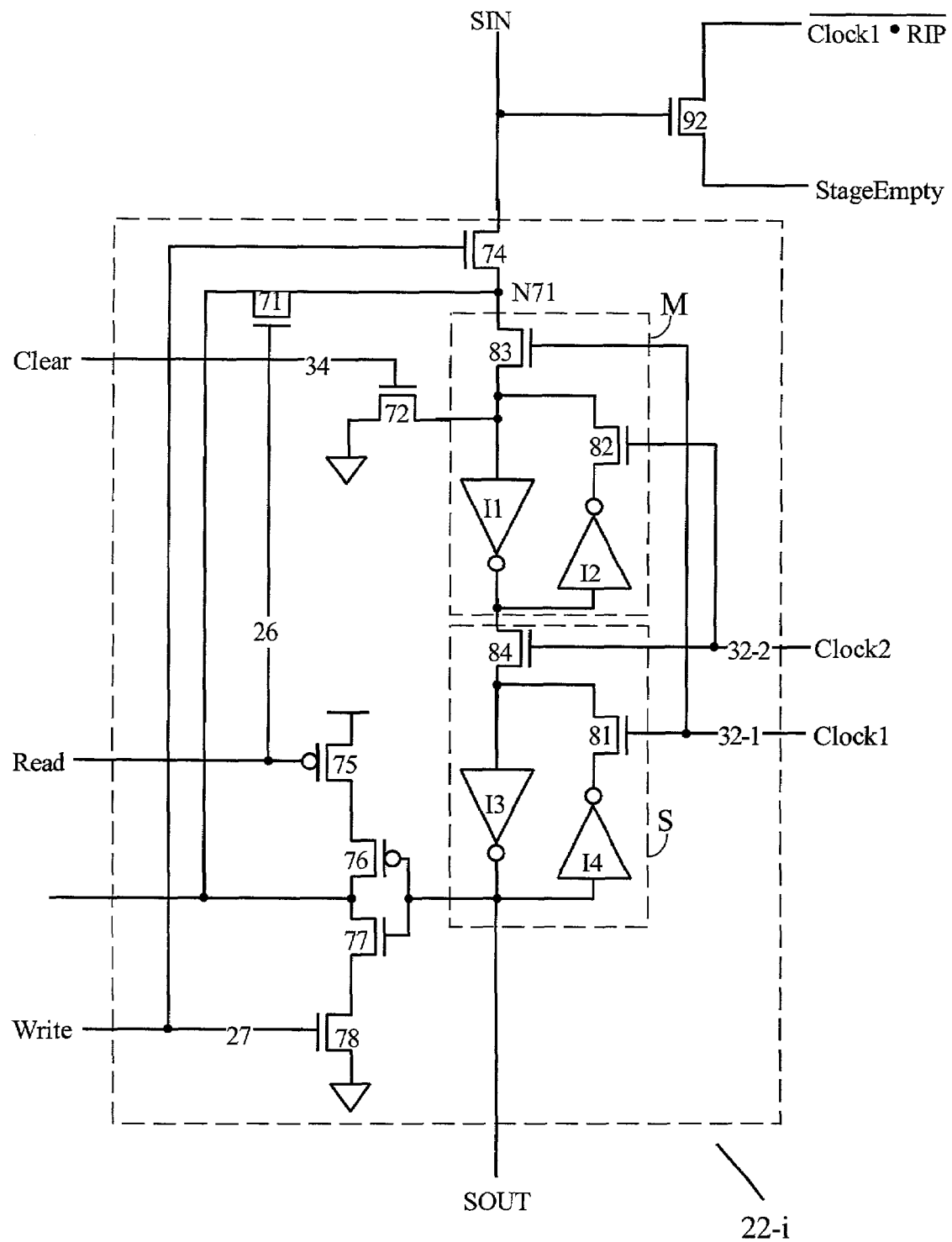

Configuration module 18a also allows for reading back data from the array 12. The data will be used for error correction. In this mode of operation, the mode selection signal on line 39 is set at a value (e.g., logic "low") that is opposite to the configuration mode. A bit, such as bit 22-i, of shift register 22 is shown in detail in FIG. 5A to further describe this aspect of the invention. Before reading back data, data shift register 22 is cleared with a high signal on line 34. At the same time, a high token signal RBToken is loaded on line 29 through OR gate 102 into flip flop 104. The read signal on line 26 is brought low and the write signal on line 27 is brought high, which, as can be seen in FIG. 5A, precharges line P1 (represents lines P1 through Pn) to logic high. The read signal on line 26 is then brought high and the write signal on line 27 is brought low, which turns off the power to transistors 75 through 78, turns off transistor 74, and turns on transistor 71. A high address strobe signal on line 36 applies data from the addressed column on array 12 to lines P1 through Pn. When clock signal Clk1 (on line 32-1 of 2-bit bus 32) goes high, line P1 drives the input terminal N71 of master latch M and the data value is stored in master latch M. The address strobe signal on line 36 is then brought low and Clk1 is brought low. When Clk2 goes high, the data bit shifts to slave latch S.

During this time, the low write signal on line 27 has held transistor 74 off so that data do not shift along the shift register. The shift register is now loaded with one bit for each row in the addressed column, and the next operation will be to shift this column of data out of the shift register. Next, the read signal on line 26 is brought low and the write signal on line 27 is brought high so that data shift from one stage to the next in data shift register 22. Clk1 and Clk2 alternately are brought high (with non-overlapping clock signals) so that data shift downward and out onto line RBData. Shifting continues until the column of data is shifted entirely out. Completion of shifting is detected when the DREmpty signal appears at the output of register R8. Another column is addressed, loaded, and shifted and the process is repeated until all columns have been shifted out.

In one embodiment of the present invention, the data on RBData line is coupled to ECCC 13, which, together with the stored error corrections, determines whether there is any error in memory cells 14. If errors are discovered, FCCC 13 corrects the error, and delivers the corrected data to data input register 20a of configuration module 18a. ECCC 13 also generates an error correction signal 40 (ECS) and applies it to control unit 24a of configuration module 18a. Control unit 24a will then transfer the data to shift register 22 for loading back to the corresponding memory cells 14.

One potential problem in applying the present invention to a FPGA is that the states of some of the components in a CLB may change after configuration during normal operation. Examples of such components are flip-flops and random access memory. FIG. 6 shows a system 180 that can solve this problem. Elements in FIGS. 2 and 6 that are the same have the same reference numerals. System 180 contains a frame register 11a that reads back the states of CLBs (such as 182a and 182b). The data in frame register 11a is delivered to an error correction code circuit 13a. Circuit 13a reads data stored in a mask storage 184, which stores information that indicates which bits in the CLBs may change during operation. The error correction algorithm is performed on the frame data with the cleared bits eliminated. Since the CLB configuration typically spans several frames, the location of the cleared bits will be different from frame to frame, but repeating regularly. Similarly, since each frame contains data from several CLBS, the mask data may represent a single CLB and the ECC circuit 13a repeats the mask for each CLB in the frame. As a result, the computation of the error correction bits will not be affected by the changed states.

Data in mask storage 184 can be set up using several methods. The data can be stored in mask-programmed read-only memory on chip because the locations of the potentially-changeable parts are known in advance. The data can also be included in the bitstream, and loaded into writable memory on chip. In the situation where it is not desirable to include the complete mask data in the bitstream, the bitstream could include an indicator on a CLB-by-CLB basis on whether or not to use the mask. For example, the bitstream could turn on the mask for those LUTs that are used as memory, while leaving the others unchanged (and therefore correctable).

Figure 6A:
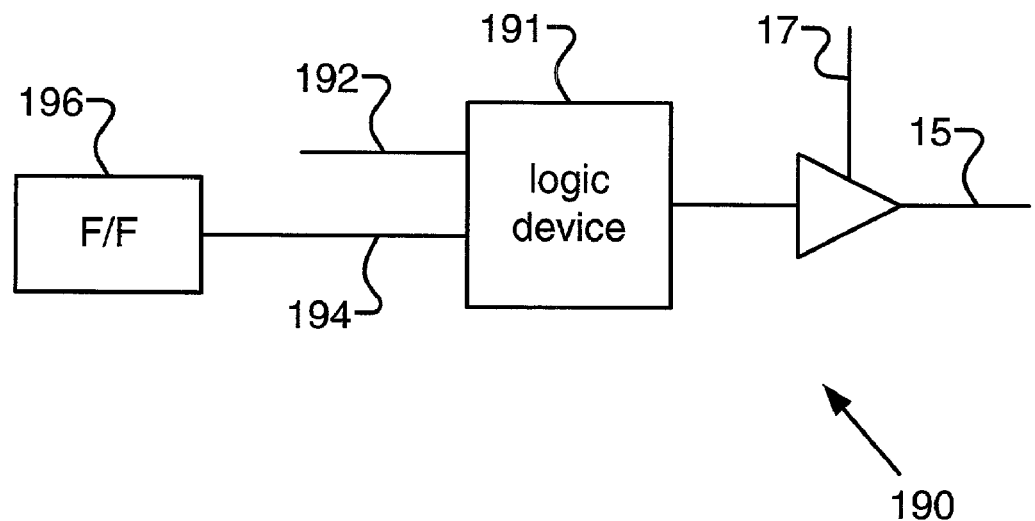
FIGS. 6, 6A and 6B show different systems capable of handling components that may change states after configuration under normal operation.
Figure 6:
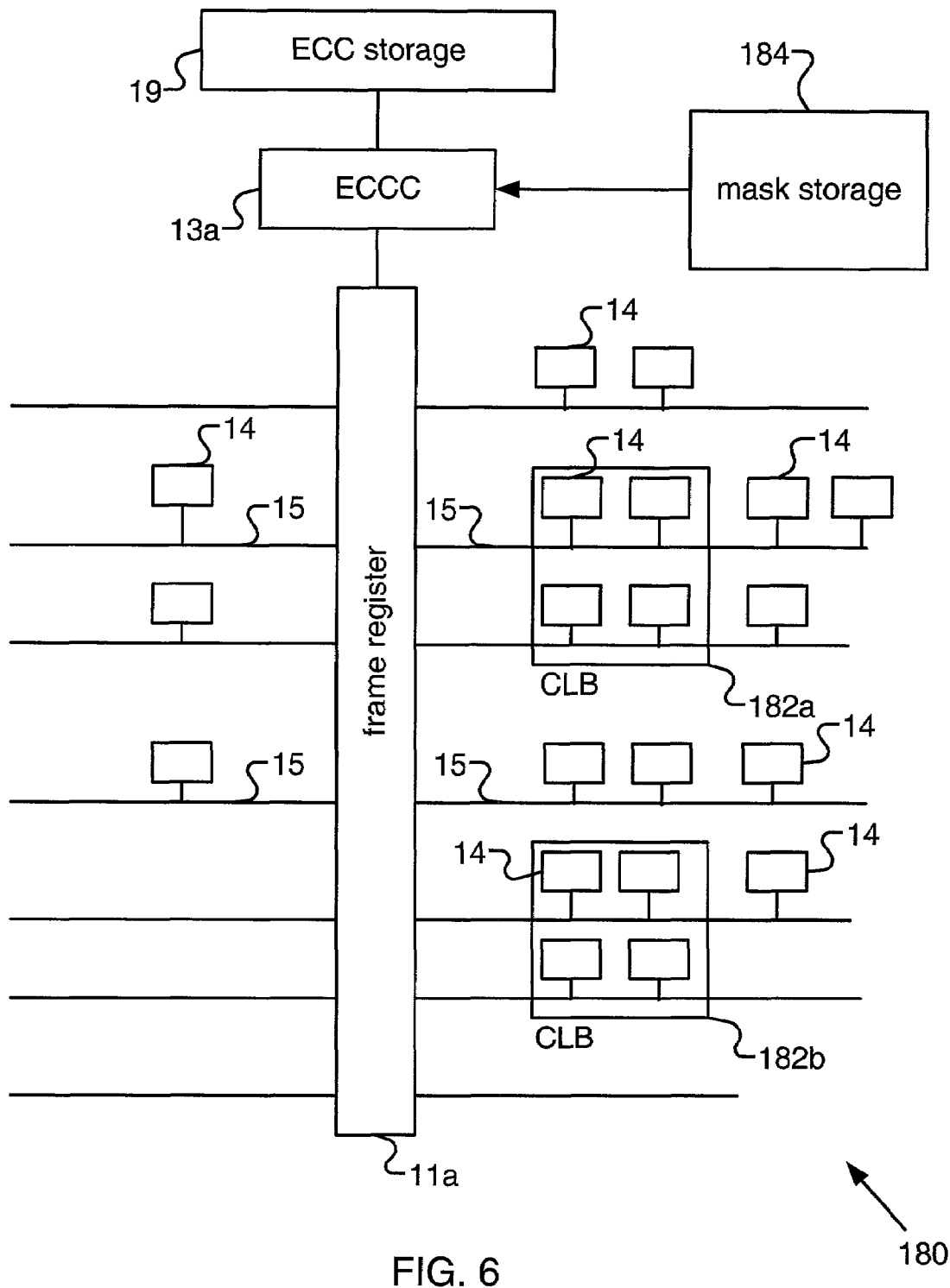

Another way to solve this problem is shown in a system 190 of FIG. 6A. The error correction code circuit contains a logic device 191 (such as an AND gate) having an input terminal 194 connected to one of the above-mentioned components of a CLB (such as a flip-flop 196), the state of which may change after configuration. Another input terminal 192 of logic device 191 is connected to a signal that indicates whether the state of flip-flop 192 has been changed after configuration. If the state has been changed, logic device 191 will shield the change from the error correction code circuit. Alternatively, terminal 192 can be a signal that indicates the bit is permitted to change during operation. This signal may be determined from other configuration bit settings such as enabling LUT Ram mode.

Figure 6B:
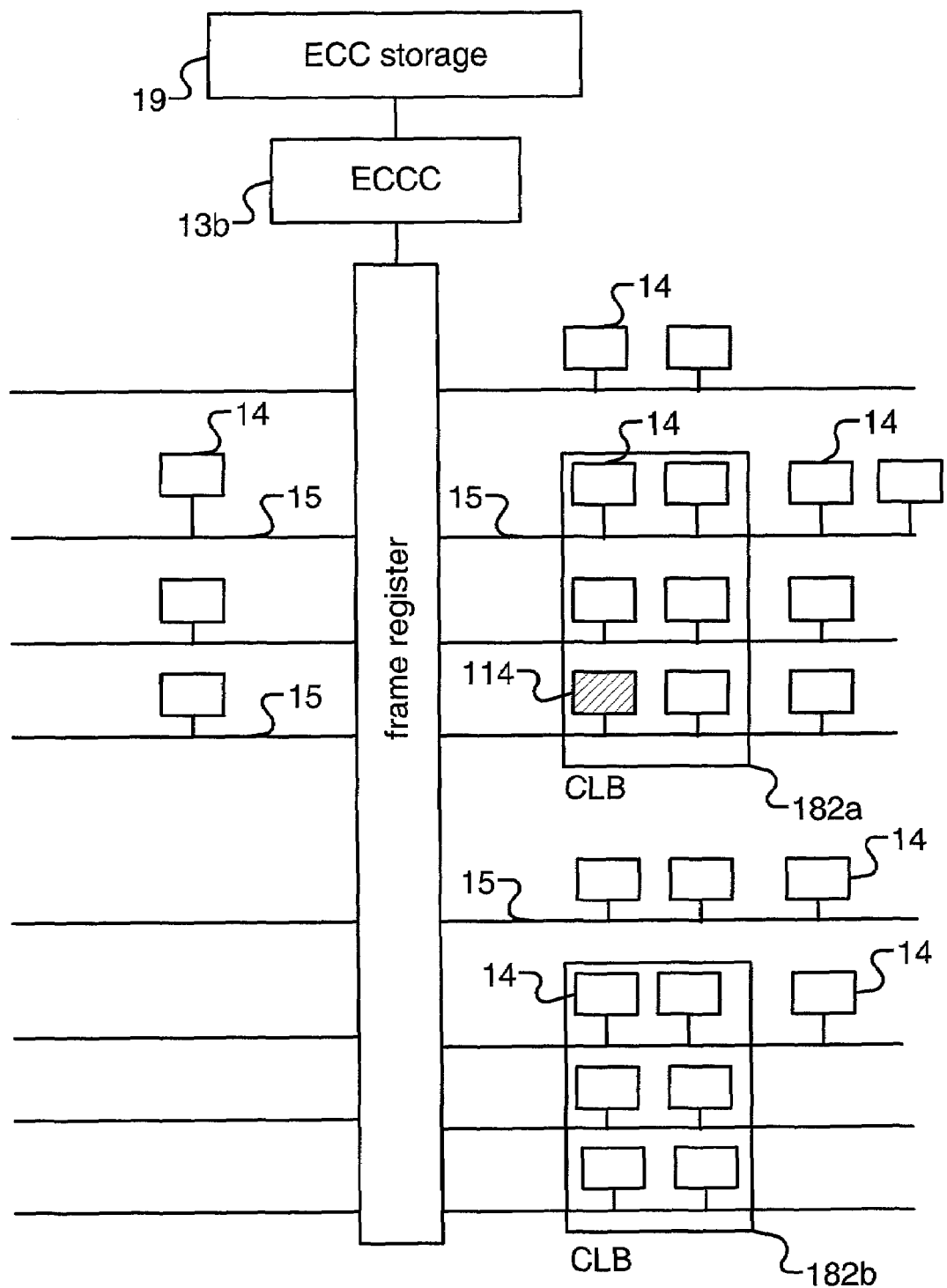

In yet another embodiment (FIG. 6B), the CLB contains additional bits 114 that read back the values that indicate which bits may change during configuration. ECCC 13b contains the logic device that clears the appropriate variable bits in the bitstream before computing the error correction code.

It is important to note that in addition to preventing variable bits from being read back, the FPGA must also prevent these bits from being written when an error is being corrected. The same signals are used to either prevent new values from being driven on data bus 15 or by preventing the variable memory cells from being addressed and hence overwritten.

Figure 7:
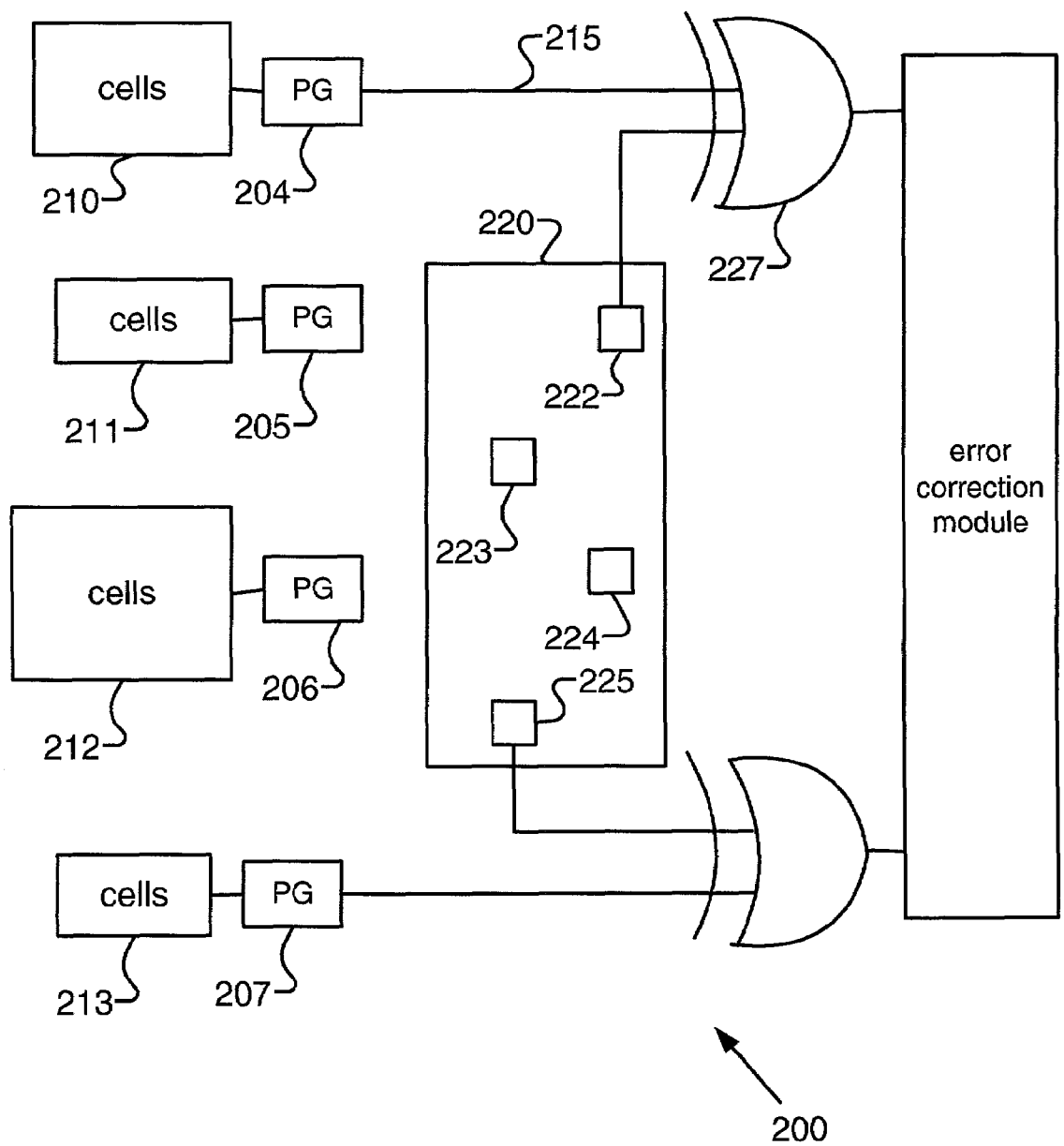
FIG. 7 is a schematic diagram of a parity based error correction system of the present invention.

A different embodiment that provides error detection and correction is now described. This embodiment uses at least one parity bit to represent the correct state of memory cells. A change in one bit triggers error correction actions. FIG. 7 is a schematic diagram of a parity based error correction system 200 of the present invention. System 200 comprises a plurality of parity bit generators, such as generator 204–207, that generate parity bits of selected combinations of memory cells (e.g., one or more frames or subsets of a frame), such as combinations 210–213. The parity bits computed from the original configuration bits of the corresponding combinations are stored in registers of an on-chip storage 220. For example, the parity bits of combinations 210–213 are stored in registers 222–225, respectively. The output of a parity bit generator and the corresponding parity bit stored in storage 220 are coupled to separate inputs of a XOR gate (or, in some situations, a XNOR gate). When there is a change in one of the memory cells connected to parity bit generator 204, the output of generator 204 changes state. This will immediately trigger action to correct the error. As a result, there is almost no delay. One advantage of this embodiment is that there is no need to use address module 16 and configuration module 18 to constantly check memory cells 14.

In one embodiment of the present invention, the trigger will cause the configuration bits of the corresponding frame (s) or subset of a frame to be reloaded from external memory. The correct data is loaded into the corresponding memory cells. In another embodiment of the present invention, ECCC 13 and error correction bit storage 19 can be used in combination with error correction system 200. The error correction bits stored in storage 19 are retrieved to reconstruct the original bits. As a result, there is no need to rely on an external memory.

Parity bits are used to detect an odd number of bit changes in a combination of memory cells. It should be note that other error detection codes (and the corresponding error detection circuits) may also be used to detect other types of bit changes.

Parity check may be on every frame in the CLB, or it may be performed on the frame data register. In this case, the frame is read back, then the parity check is performed. If there is an error, the correct frame is loaded and written back to the CLB.

Note that not all bits need to be included in a parity chain. For example, the bits that are permitted to change during operation of the FPGA can be skipped.

It can be seen from the above description that a novel error correction system and methods for implementing the same have been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

I claim:

1. A method for continuously correcting errors in memory cells of a FPGA, said memory cells being arranged in rows and columns, said method comprising the steps of:
storing predetermined sets of error correction bits in a plurality of memory locations, each of said predetermined sets being associated with one of said columns of memory cells;
retrieving data stored in a column of said memory cells on said FPGA;
delivering said data to an error correction code circuit on said FPGA;
calculating by said error correction code circuit a set of error correction bits associated with said data;
comparing said set of error correction bits associated with said data with a predetermined set of error correction bits stored in said plurality of memory locations corresponding to said column in said retrieving step;
if said set of error correction bits associated with said data is different from said corresponding predetermined set of error correction bits, correcting said data using said corresponding predetermined set of error correction bits;
incrementing to a next column of memory cells; and
continuously repeating said retrieving, delivering, calculating, comparing, correcting and incrementing steps so that errors in each of said columns are repeatedly corrected.

2. The method of claim 1 wherein each of said sets of error correction bits is capable of correcting a single bit of error in said data.

3. The method of claim 1 wherein each of said sets of error correction bits is capable of correcting more than one bit of errors in said data.

4. The method of claim 1 wherein said FPGA is configured by frames of configuration data received from an external memory, said method further comprising the steps of:
receiving said frames of configuration data; and
computing said predetermined sets of error correction bits from said received frames of configuration data.

5. The method of claim 1 wherein said FPGA is configured by frames of configuration data received from an external memory and wherein said error correction bits are computed outside of said FPGA and stored in said external memory, said method further comprising a step of retrieving said error correction bits from said external memory.

6. The method of claim 1 wherein said FPGA contains components that change states after configuration, said method further comprising a step of removing said states from said calculating and said comparing steps.

7. The method of claim 6 wherein each of said sets of error correction bits is capable of correcting a single bit of error in said data.

8. The method of claim 6 wherein each of said sets of error correction bits is capable of correcting more than one bit of errors in said data.

9. The method of claim 6 wherein said FPGA is configured by frames of configuration data received from an external memory, said method further comprising the steps of:
receiving said frames of configuration data; and
computing said predetermined sets of error correction bits from said received frames of configuration data.

10. The method of claim 6 wherein said FPGA is configured by frames of configuration data received from an external memory and wherein said error correction bits are computed outside of said FPGA and stored in said external memory, said method further comprising a step of retrieving said error correction bits from said external memory.

11. An on-chip FPGA error correction system for correcting errors stored in an array of memory cells arranged in rows and columns, said system comprising:
an error correction code circuit on said FPGA adapted to compute error correction bits;
an address module adapted to operate in one of two modes comprising a configuration mode for loading data into said array of memory cells and an error correction mode for detecting errors in said data;
a module for sequentially retrieving data stored in each column of said memory cells on said FPGA and delivering said data to said error correction code circuit;
a plurality of memory locations for storing predetermined sets of error correction bits associated with said columns of said memory cells; and
said error correction code circuit receiving said data and computing a set of error correction bits, said error correction code circuit further comparing said computed set with a corresponding one of said predetermined sets of error correction bits in said plurality of memory locations, and if said computed set is different from said corresponding set, correcting said data using said corresponding predetermined set of error correction bits.

12. The system of claim 11 wherein each of said error correction bits is capable of correcting a single bit of error.

13. The method of claim 11 wherein each of said sets of error correction bits is capable of correcting more than one bit of errors in said data.

14. The system of claim 11 wherein said FPGA system is configured by frames of configuration data received from an external memory, said system further comprising a module for reading said frames of configuration data and delivering said frames to said error correction code circuit, and said error correction code circuit further computing said predetermined sets of error correction bits from said frames and storing said predetermined sets of error correction bits in said plurality of memory locations.

15. The system of claim 11 wherein said plurality of memory locations are arranged into one storage.

16. The system of claim 11 further comprising a mask storage for removing one of said memory cells from said computed set of error correction bits.

17. The system of claim 11 wherein said plurality of memory locations is divided into columns, and each of said columns of memory locations is attached to one of said columns of memory cells.

18. The system of claim 17 wherein each of said error correction bits is capable of correcting a single bit of error.

19. The method of claim 17 wherein each of said sets of error correction bits is capable of correcting more than one bit of errors in said data.

20. The system of claim 17 wherein said FPGA system is configured by frames of configuration data received from an external memory, said system further comprising a module for reading said frames of configuration data and delivering said frames to said error correction code circuit, and said error correction code circuit further computing said predetermined sets of error correction bits from said frames and storing said predetermined sets of error correction bits in said plurality of memory locations.

21. The system of claim 17 wherein said plurality of memory locations are arranged into one storage.

22. The system of claim 17 further comprising a mask storage for removing one of said memory cells from said computed set of error correction bits.

23. The system of claim 17 further comprising at least one logic device for preventing one of said memory cells from affecting said computed set of error correction bits.

* * * * *